United States Patent
Sharma

(10) Patent No.: US 12,396,196 B2
(45) Date of Patent: Aug. 19, 2025

(54) PROTECTIVE STRUCTURE WITH DEPLETION-MODE AND ENHANCEMENT-MODE TRANSISTORS

(71) Applicant: GlobalFoundries U.S. Inc., Malta, NY (US)

(72) Inventor: Santosh Sharma, Austin, TX (US)

(73) Assignee: GlobalFoundries U.S. Inc., Malta, NY (US)

( * ) Notice: Subject to any disclaimer, the term of this patent is extended or adjusted under 35 U.S.C. 154(b) by 600 days.

(21) Appl. No.: 17/891,244

(22) Filed: Aug. 19, 2022

(65) Prior Publication Data
US 2024/0063301 A1    Feb. 22, 2024

(51) Int. Cl.
    *H10D 30/47*     (2025.01)
    *H10D 62/10*     (2025.01)
    *H10D 62/85*     (2025.01)
    *H10D 89/60*     (2025.01)

(52) U.S. Cl.
    CPC ......... *H10D 30/475* (2025.01); *H10D 62/117* (2025.01); *H10D 62/8503* (2025.01); *H10D 89/811* (2025.01)

(58) Field of Classification Search
    CPC .................................................. H10D 30/475
    USPC ........................................................ 257/194
    See application file for complete search history.

(56) References Cited

U.S. PATENT DOCUMENTS

| | | | |
|---|---|---|---|
| 4,873,458 A | * | 10/1989 | Yoshida ............... H03K 17/223 327/512 |
| 4,931,669 A | * | 6/1990 | Higashisaka .... H03K 19/01721 326/82 |
| 8,785,973 B2 | | 7/2014 | Vashchenko |
| 10,290,623 B2 | | 5/2019 | Roberts et al. |
| 11,128,117 B2 | | 9/2021 | Takahashi et al. |
| 2016/0372920 A1 | | 12/2016 | Kinzer et al. |
| 2017/0243862 A1 | | 8/2017 | Parthasarathy et al. |
| 2018/0026029 A1 | | 1/2018 | Lin et al. |

(Continued)

FOREIGN PATENT DOCUMENTS

| | | |
|---|---|---|
| EP | 2881989 A1 | 6/2015 |
| KR | 20140057543 A | 5/2014 |

(Continued)

OTHER PUBLICATIONS

Lee et al., "Incorporation of a Simple ESD Circuit in a 650V E-Mod GaN HEMT for All-Terminal ESD Protection," 2022 IEEE International Reliability Physics Symposium (IRPS), 2022 pp. 2B.3-1-2B.3-6.

(Continued)

*Primary Examiner* — Ajay Arora
(74) *Attorney, Agent, or Firm* — Francois Pagette; Hoffman Warnick LLC

(57) ABSTRACT

Disclosed are protective structures using depletion-mode and enhancement-mode transistors. A structure according to the disclosure may include a depletion-mode transistor having a gate coupled to ground and a first source/drain terminal. An enhancement-mode transistor includes a gate coupled to a second source/drain terminal of the depletion-mode transistor and a first source/drain terminal coupled to the gate of the depletion-mode transistor. The depletion-mode transistor limits a current flow from the first source/drain terminal to the gate of the enhancement-mode transistor.

20 Claims, 4 Drawing Sheets

(56) References Cited

U.S. PATENT DOCUMENTS

2020/0365581 A1* 11/2020 Guan ..................... H02H 9/046
2021/0335771 A1* 10/2021 Lee ....................... H10D 62/85

FOREIGN PATENT DOCUMENTS

| KR | 20180109996 A | 10/2018 |
|---|---|---|
| TW | 201929044 A | 7/2019 |
| TW | 202046502 A | 12/2020 |
| TW | 202213700 A | 4/2022 |

OTHER PUBLICATIONS

Wang, et al., "Development of an Electrostatic Discharge Protection Solution in GaN Technology"; Dec. 2013; IEEE Electron Device Letters; vol. 34, No. 12; pp. 3.

* cited by examiner

PROTECTIVE STRUCTURE WITH DEPLETION-MODE AND ENHANCEMENT-MODE TRANSISTORS

BACKGROUND

Field of the Invention

The present disclosure relates to transistors, such as III-V high electron mobility transistors (HEMTs) and other types of transistors. More particularly, the present disclosure relates to embodiments of a protective structure implementing depletion-mode and enhancement-mode transistors.

Description of Related Art

III-V semiconductor devices, such as high electron mobility transistors (HEMTs) have emerged as a leading technology for power switching, radio frequency (RF) and millimeter wave (mmWave) (e.g., 3-300 GHz) wireless applications. HEMTs offer high conduction and low resistive losses in comparison to conventional silicon-based devices. Similar to other circuit structures, HEMTs may be susceptible to electrostatic discharge (ESD) strikes during operation. HEMT gate may be particularly sensitive to ESD strikes due to the lower threshold and breakdown voltages intrinsic to HEMT gates and the material(s) on which they are formed. Conventional approaches for ESD protection in HEMTs or similar instructions have included, e.g., adding a resistor in series with other ESD protective elements. However, such an approach has resulted in slower gate transition speeds of a device when an ESD event is not occurring.

SUMMARY

All aspects, examples and features mentioned herein can be combined in any technically possible way.

Embodiments disclosed herein provide a structure including: a depletion-mode transistor having a gate coupled to ground and a first source/drain terminal; and an enhancement-mode transistor having a gate coupled to a second source/drain terminal of the depletion-mode transistor and a first source/drain terminal coupled to the gate of the depletion-mode transistor.

Another aspect of the disclosure includes any of the preceding aspects, and wherein the first source/drain terminal of the depletion-mode transistor is coupled to an integrated circuit (IC) component.

Another aspect of the disclosure includes any of the preceding aspects, and wherein the depletion-mode transistor and the enhancement-mode transistor each include a high electron mobility transistor (HEMT) over a III-V semiconductor substrate.

Another aspect of the disclosure includes any of the preceding aspects, and wherein the depletion-mode transistor and the enhancement-mode transistor each include an aluminum gallium nitride (AlGaN) layer over a gallium nitride (GaN) layer such that an AlGaN/GaN interface is between the AlGaN layer and the GaN layer.

Another aspect of the disclosure includes any of the preceding aspects, and wherein the enhancement-mode transistor further includes a second source/drain terminal is decoupled from the first source/drain terminal of the depletion-mode transistor.

Another aspect of the disclosure includes any of the preceding aspects, and wherein the depletion-mode transistor comprises a portion of an electrostatic discharge (ESD) protective circuit.

Another aspect of the disclosure includes any of the preceding aspects, and wherein a pinch-off voltage of the depletion-mode transistor is at most approximately eight volts (V).

Further embodiments disclosed herein provide a structure including: a depletion-mode transistor including a first gate coupled to an integrated circuit (IC) component, a first source, and a first drain; and an enhancement-mode transistor including a second gate coupled to the first source, a second source coupled to the first gate through the IC component, and a second drain, wherein a composition of the first gate is different from a composition of the second gate.

Another aspect of the disclosure includes any of the preceding aspects, and wherein the depletion-mode transistor and the enhancement-mode transistor are each over a III-V semiconductor substrate.

Another aspect of the disclosure includes any of the preceding aspects, and wherein the depletion-mode transistor and the enhancement-mode transistor each include an aluminum gallium nitride (AlGaN) layer over a gallium nitride (GaN) layer such that an AlGaN/GaN interface is between the AlGaN layer and the GaN layer.

Another aspect of the disclosure includes any of the preceding aspects, and wherein the second drain is decoupled from the IC component.

Another aspect of the disclosure includes any of the preceding aspects, and wherein the depletion-mode transistor comprises a portion of an electrostatic discharge (ESD) protective circuit.

Another aspect of the disclosure includes any of the preceding aspects, and wherein a pinch-off voltage of the depletion-mode transistor is at most approximately eight volts (V).

Additional embodiments disclosed herein provide a structure including: a first enhancement-mode transistor having a gate coupled to an integrated circuit (IC) component and a first source/drain terminal coupled to ground; a second enhancement-mode transistor having a first source/drain terminal coupled to the IC component, a second source/drain terminal coupled to ground, and a gate terminal; and a depletion-mode transistor having a first source/drain terminal coupled to a capacitor, a second source/drain terminal coupled to a resistor and the gate terminal of the second enhancement-mode transistor, and a gate terminal coupled to ground, wherein the resistor couples the gate terminal of the second enhancement-mode transistor and the second source/drain terminal of the depletion-mode transistor to gate of the depletion-mode transistor.

Another aspect of the disclosure includes any of the preceding aspects, and wherein the gate terminal of the depletion-mode transistor includes a different material composition from the gate terminal of the first enhancement-mode transistor and the second enhancement-mode transistor.

Another aspect of the disclosure includes any of the preceding aspects, and wherein the first enhancement-mode transistor, the second enhancement-mode transistor, and the depletion-mode transistor each include a high electron mobility transistor (HEMT) over a III-V semiconductor substrate.

Another aspect of the disclosure includes any of the preceding aspects, and wherein the first enhancement-mode transistor, the second enhancement-mode transistor, and the depletion-mode transistor each include an aluminum gallium nitride (AlGaN) layer over a gallium nitride (GaN)

layer such that an AlGaN/GaN interface is between the AlGaN layer and the GaN layer.

Another aspect of the disclosure includes any of the preceding aspects, and wherein the first enhancement-mode transistor further includes a second source/drain terminal is decoupled from the IC component.

Another aspect of the disclosure includes any of the preceding aspects, and wherein the depletion-mode transistor comprises a portion of an electrostatic discharge (ESD) protective circuit.

Another aspect of the disclosure includes any of the preceding aspects, and wherein a pinch-off voltage of the depletion-mode transistor is at most approximately eight volts (V).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
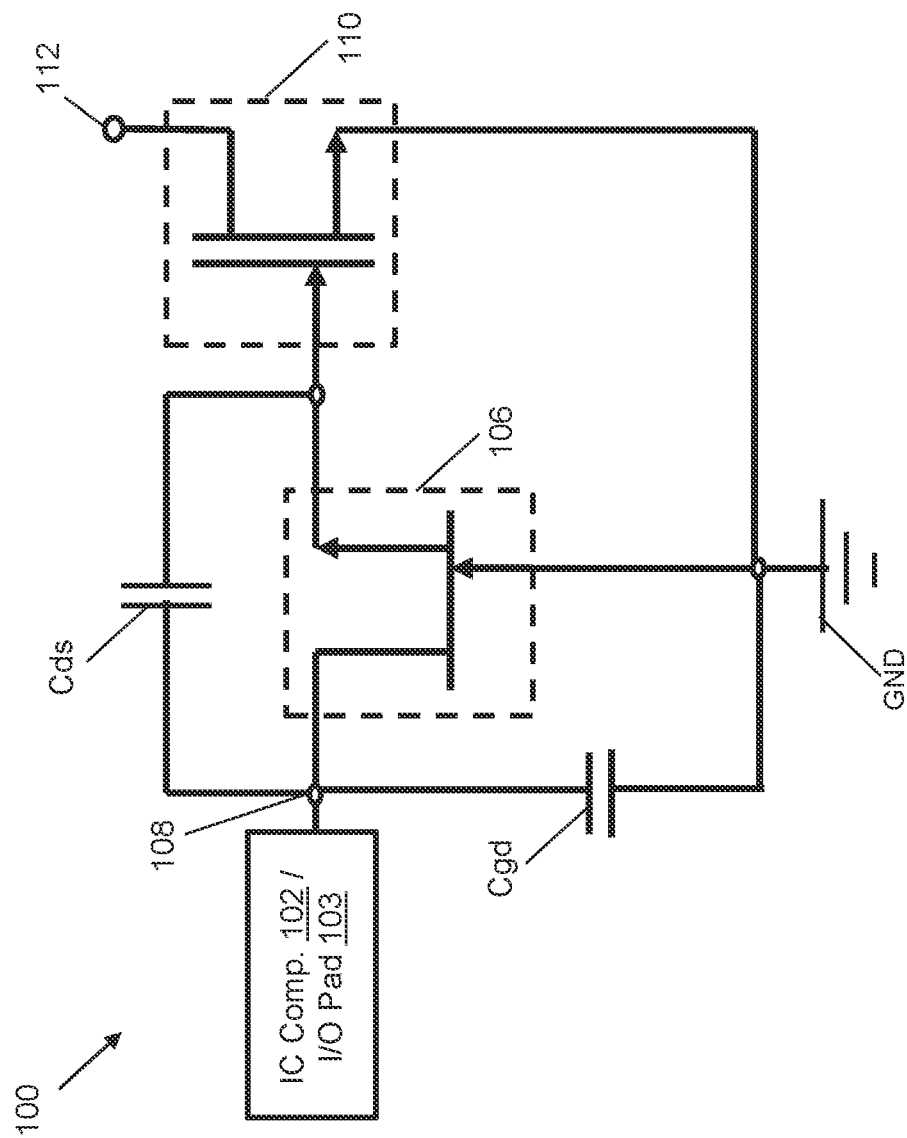
FIG. 1 provides a schematic diagram of a structure according to embodiments of the disclosure.

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

III-V semiconductor devices, such as high electron mobility transistors (HEMTs) have emerged as a leading technology for power switching, radio frequency (RF) and millimeter wave (mmWave) (e.g., 3-300 GHz) wireless applications. HEMTs offer high conduction and low resistive losses in comparison to conventional silicon-based devices. Similar to other circuit structures, HEMTs may be susceptible to electrostatic discharge (ESD) strikes during operation. HEMT gate may be particularly sensitive to ESD strikes due to the lower threshold and breakdown voltages intrinsic to HEMT gates and the material(s) on which they are formed. Conventional approaches for ESD protection in HEMTs or similar instructions have included, e.g., adding a resistor in series with other ESD protective elements. However, such an approach has resulted in slower gate transition speeds of a device when an ESD event is not occurring.

In view of the foregoing, disclosed herein are embodiments of a structure that includes a depletion-mode transistor having a gate coupled to ground and a first source/drain terminal. The first source/drain terminal may be coupled to a component and/or portion of a circuit that is susceptible to ESD events. The depletion-mode transistor may be an HEMT or similar device built upon a III-V semiconductor substrate. An enhancement-mode transistor may have a gate coupled to a second source/drain terminal of the depletion-mode transistor and a first source/drain terminal coupled to the gate of the depletion-mode transistor. The depletion-mode transistor thus limits a current flow from the first source/drain terminal to the gate of the depletion-mode transistor, e.g., by simultaneously enabling current flow through the depletion-mode transistor and in turn enabling a voltage biasing of the depletion-mode transistor gate. The voltage biasing of the depletion-mode transistor gate may occur, e.g., by the current flow from the depletion-mode transistor electrically biasing the enhancement-mode transistor to enable current flow from the input node to the depletion-mode transistor gate. In further embodiments, structure of the disclosure may include multiple depletion-mode transistors for ESD protection of amplifiers and/or other components.

A depletion-mode transistor refers to a device that allows current to pass from source to drain when the gate voltage is less than its pinch-off voltage but prevents current from passing from source to drain when the gate voltage meets or exceeds the pinch-off voltage. By contrast, an enhancement-mode transistor refers to a device that prevents current from passing from source to drain when the gate voltage is less than its threshold voltage (i.e., distinguishable from "pinch-off voltage" in the case of a depletion-mode transistor) but allows current flow from source to drain when the gate voltage meets or exceeds the transistor's threshold voltage. Embodiments of the disclosure integrate depletion-mode and enhancement-mode transistors into a single structure to protect against ESD events as a device operates.

Generally, depletion-mode and enhancement-mode transistors such as HEMTs may be provided by forming a stack of layers required for transistor formation (e.g., required for high electron mobility transistor (HEMT) formation, required for metal-insulator-semiconductor HEMT (MISHEMT) formation, or required for formation of some other similar type of transistor). The stack then may be used to form or otherwise define the transistor (e.g., a HEMT, MISHEMT, etc.) with multi-level self-aligned gate and source/drain terminals so that fails related to terminal misalignment are avoided (e.g., as device sizes are reduced). Depletion-mode- and enhancement-mode transistors described herein are structured to include a junction between two materials with different band gaps (i.e., a heterojunction), defining a channel between source and drain terminal instead of a doped semiconductor layer (i.e., as would be the case in a field effect transistor ("FET")). Depletion-mode and enhancement-mode transistors discussed herein thus may be formed on a III-V semiconductor substrate and further may include gallium nitride (GaN) as one of the materials used to form the barrier layer for the transistor channel.

Referring to FIG. 1, embodiments of the disclosure provide a structure 100 configured for being coupled between an integrated circuit (IC) component 102 or an input/output (I/O) pad 103 and a zero-voltage node (i.e., ground "GND") to provide an alternate current pathway to bypass various portions of a device when an ESD event occurs. IC component 102 may include, e.g., a logic circuit, power generation component, and/or other element formed on a substrate and otherwise susceptible to damage from excess voltage throughout the duration of an ESD event. I/O pad 103 may be a conductive structure and/or material for electrically connecting structure 100 to other devices or circuits, e.g., possibly external to structure 100. Structure 100 may include a depletion-mode transistor 106 having a gate terminal that is coupled to ground GND and a first source/drain terminal that is coupled to an input node 108. Input node 108 may be coupled to IC component 102 and/or I/O pad 103, thereby defining the coupling between structure 100 and other circuitry to be protected during an ESD event. As discussed elsewhere herein, depletion-mode transistor 106 initially allows current flow unimpeded from source to drain but may prevent such flow from occurring when its gate terminal meets or exceeds a pinch-off voltage.

Structure 100 may include an enhancement-mode transistor 110, in which the gate of enhancement-mode transistor is coupled to a second source/drain terminal of depletion-mode transistor 106. To provide the different electrical characteristics of depletion-mode transistor 106 and enhancement-mode transistor 110, each type of transistor 106, 110 may have distinct gate compositions. Transistors 110, 106 can be above multiple epitaxially grown semiconductor layers on a semiconductor substrate. The semiconductor substrate can be, for example, a silicon or silicon-based substrate (e.g., a silicon carbide (SiC) substrate), a sapphire substrate, a III-V semiconductor substrate (e.g., a gallium nitride (GaN) substrate or some other suitable III-V semiconductor substrate), a silicon substrate (perhaps doped p-type), or any other suitable substrate for a III-V semiconductor device. Epitaxially grown semiconductor layers on the substrate 1 can include, for example: an optional buffer layer on the top surface of the semiconductor substrate, a channel layer on the buffer layer 116, and/or a barrier layer on the channel layer. These epitaxially grown semiconductor layers can be, for example, III-V semiconductor layers. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP).

Optionally, each transistor 106, 110 may include or otherwise be formed on buffer layers (undoped or doped, e.g., with carbon) to facilitate growth of the channel layer thereon and to account for lattice constants in the underlying and overlying layers. The buffer layers, where included, can have a band gap that is wider than the bandgap of the material(s) used to define the device channel. Those skilled in the art will recognize that the barrier and channel materials can be selected so that a heterojunction is formed at the interface between the two layers, thereby resulting in the formation of a two-dimensional electron gas (2DEG) region in the device's channel layer, e.g., to provide the conductive pathway for the drifting of charges between the source and the drain. In some embodiments, the buffer layer(s) could be a carbon-doped gallium nitride (C—GaN) buffer layer or a buffer layer of any other material suitable for use as a buffer layer of a HEMT or MISHEMT. Here, the channel layer could be a gallium nitride (GaN) layer or a III-V semiconductor channel layer made of any other III-V semiconductor compound suitable for use as a channel layer in a HEMT or MISHEMT. Hence, the channel layer may also be referenced as a "GaN channel layer" herein. Transistor(s) 106, 110 further may include a barrier layer of aluminum gallium nitride (AlGaN) or any other material suitable for use as a barrier layer in a HEMT or MISHEMT. Alternatively, any one or more of the epitaxially grown layers could be multi-layered structures (e.g., comprising multiple sub-layers of different buffer materials, multiple sub-layers of different III-V semiconductor channel materials and/or multiple sub-layers of different barrier materials). Transistor(s) 106, 110 may include one or more passivation layers over the barrier layer. Passivation layers, where included, may include one or more layers of any appropriate passivation material such as but not limited to aluminum oxide ($Al_2O_3$), silicon nitride ($Si_3N_4$) and/or silicon oxide ($SiO_x$).

In still further implementations, transistors 106, 110 may have distinct gate conductors and/or other materials apart from AlGaN to further distinguish their response to voltage biases during operation. Depletion-mode transistor, for example, may include a gate conductor on an AlGaN layer. Additional doping of depletion-mode transistor 106 may not be necessary, e.g., due to the intrinsic n-type doping of GaN. The gate conductor of depletion-mode transistor 106 may have the same composition as conductive contacts for source and/or drain contacts to depletion-mode transistor 106. Enhancement-mode transistor 110 may differ from depletion-mode transistor, e.g., by having a layer of p-type doped GaN ("p-GaN") on the AlGaN layer of its gate, and further may have a gate conductor thereon. The presence of p-GaN on the gate of enhancement-mode transistor 110 may cause the above-described operational differences of enhancement-mode transistor 110 as compared to depletion-mode transistor 106. In other respects, however, transistors 106, 110 may include similar or identical structural features.

As discussed elsewhere herein, enhancement-mode transistor initially prevents current from flowing from source to drain unless its gate terminal meets or exceeds a threshold voltage. In this configuration, the source-to-drain pathway of depletion-mode transistor 106 couples input node 108 to the gate of enhancement-mode transistor 110. One source or drain terminal of enhancement-mode transistor 110 may be coupled to the gate terminal of depletion-mode transistor 106 (e.g., through the node connected to ground GND), such that current passing from source to drain of depletion-mode transistor 106 defines the gate bias of enhancement-mode transistor 110, and thus controls whether the gate terminal of enhancement-mode transistor 106 is at or above its threshold voltage.

A supply node 112 may be coupled to the other source or drain terminal of enhancement-mode transistor 110, and supply node 112 may be set to the same level as a voltage supply for the device having structure 100 therein. Since the voltage level in supply node 112 is fixed, current entering structure 100 at input node 108 will simultaneously affect both the voltage bias of enhancement-mode transistor 110 and the voltage bias of depletion-mode transistor 106.

When current flow in depletion-mode transistor 106 is not enabled (i.e., its gate voltage meets or exceeds the pinch-off voltage), depletion-mode transistor 106 may exhibit an intrinsic parasitic capacitance Cds across its source and drain terminals. The level of parasitic capacitance Cds, in some cases, may cause voltage spikes from an ESD event to couple into the gate of enhancement-mode transistor 110 (i.e., via the capacitive coupling shown in FIG. 1). To offset the risks of such an event, depletion-mode transistor 106 may include one or more field plates integrated into the gate of the transistor and located between source and drain terminals of the transistor. The gate is thus coupled to ground GND as shown in FIG. 1, to produce an additional capacitance Cgd. Additional capacitance Cgd, when created, may increase the capacitance of depletion-mode transistor 106 to avoid parasitic capacitance Cds from interfering with the intended operation of structure 100. The more highly capacitive connection to ground through additional capacitance Cgd will produce more significant current than would otherwise occur through the pathway having parasitic capacitance Cds, thus directing a higher proportion of ESD current(s) from IC component 102 and/or I/O pad 103 through depletion-mode transistor 106.

During operation, an ESD strike on IC component 102 and/or I/O pad 103 will cause the gate voltage of enhancement-mode transistor 110 to rise as high as the pinch-off voltage of depletion-mode transistor 106. However, the gate of depletion-mode transistor 106 is coupled to a source/drain terminal of enhancement-mode transistor 110. Thus, enhancement-mode transistor 110 will only allow current flow (including, e.g., charge produced from an ESD event) when the voltage differential from gate to source ("Vgs," shown in FIG. 2 and discussed herein) is greater than the pinch-off voltage of depletion-mode transistor 106. So long as the pinch-off voltage of depletion-mode transistor 106 is less than the breakdown voltage of both transistors 106, 110 in structure 100, transistors 106, 110 will cooperatively define a current pathway from supply node 112 without raising the gate voltage of either transistor 106, 110 above its breakdown voltage. In other words, depletion-mode transistor 106 will block an incoming ESD voltage from harming enhancement-mode transistor 110, e.g., by depletion-mode transistor 106 disabling current flow from source to drain concurrently with enhancement-mode transistor 110 enabling current flow from source to drain. Enhancement-mode transistor 110, during operation, will limit current flow through structure 100 due to the simultaneous disabling of source to drain current flow in depletion-mode transistor 106.

Figure 2:
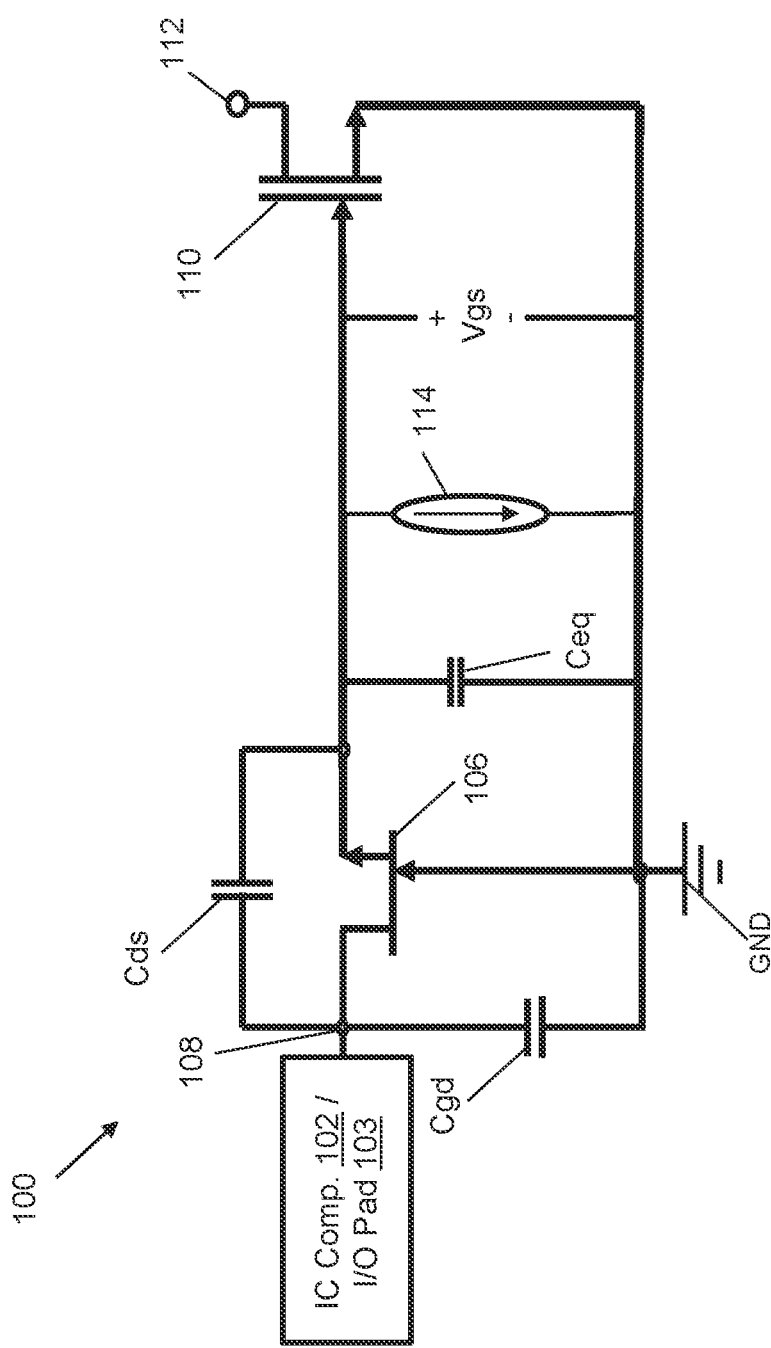
FIG. 2 provides a schematic diagram of a structure according to embodiments of the disclosure and including capacitive junctions and leakage paths.

Referring now to FIG. 2, a more detailed schematic diagram of structure 100 is shown to further illustrate operational aspects of structure 100. As discussed elsewhere herein, an open circuit between the gate of enhancement-mode transistor 110 and ground GND is shown to illustrate the voltage differential from gate to source, Vgs, in enhancement-mode transistor 110. The source-to-drain capacitance of depletion-mode transistor (Ceq) may be equal to the sum of additional capacitance Cgd and parasitic capacitance Cds, and thus an additional capacitor is shown to illustrate the equivalent capacitance between the source and gate terminals of depletion-mode transistor 106. During operation, a leakage current 114 may be present from the gate to source of enhancement-mode transistor 110.

As discussed herein, depletion-mode transistor 106 limits a current flow from IC component 102 and/or I/O pad 103 to the gate of depletion-mode transistor 106. Depletion-mode transistor 106 implements this function, e.g., by controlling whether leakage current 114 is of sufficient magnitude to dissipate accumulated charge from device 102. Leakage current 114 in particular may reduce the maximum value and hence gate voltage of enhancement-mode transistor 110 when the current through depletion-mode transistor 106 saturates. Structure 100 thus may allow leakage current 114 to dissipate accumulated charge from IC component 102 and/or I/O pad 103 during an ESD event, e.g., when the maximum gate-to-source voltage Vgs of enhancement-mode transistor 110 is approximately the same as the threshold voltage for depletion-mode transistor 106. Thus, during an ESD event, depletion-mode transistor 106 will allow leakage current 114 to pass through enhancement-mode transistor 110 to provide charge dissipation through structure 100. When an ESD event does not occur, depletion-mode transistor 106 will instead operate as a resistor, having a low impedance to avoid leakage from IC component 102 and/or I/O pad 103 but of high enough value to prevent charge dissipation when an ESD event does not occur.

Figure 3:
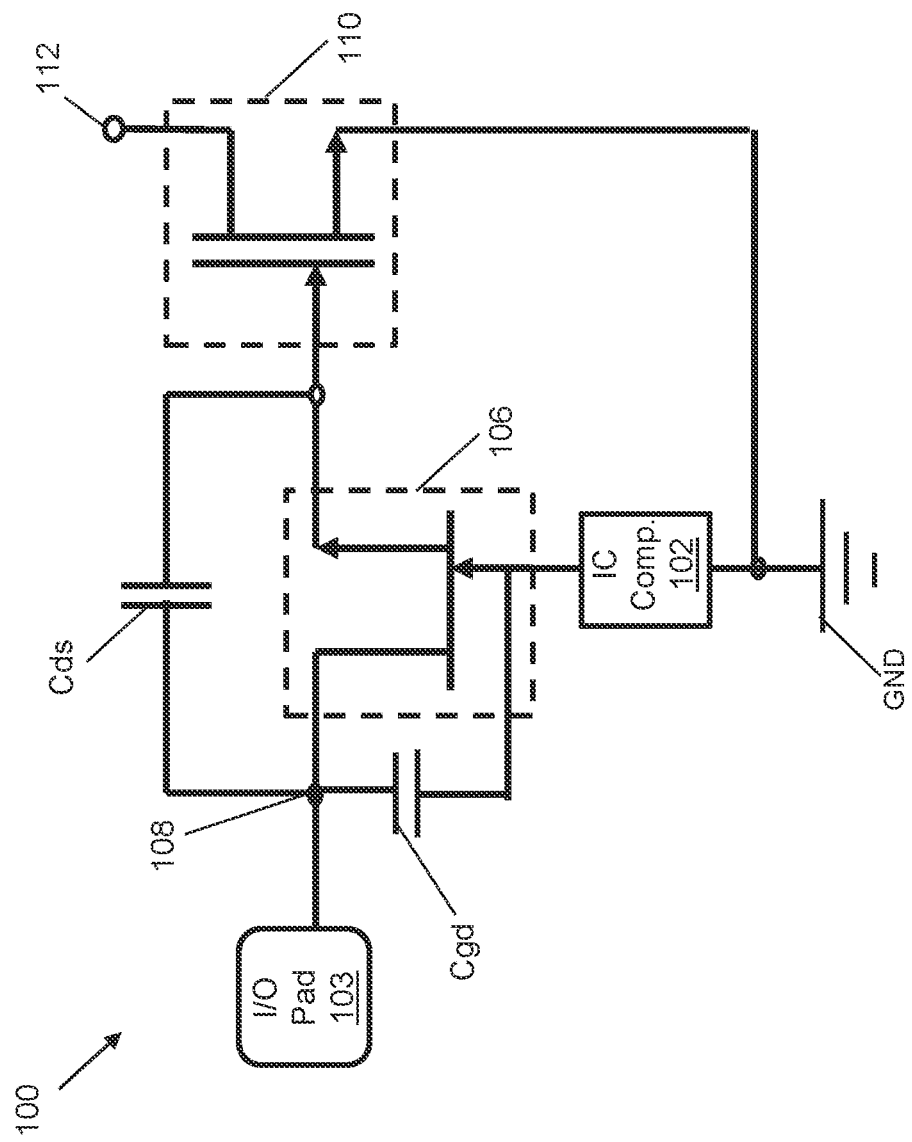
FIG. 3 provides a schematic diagram of a structure according to further embodiments of the disclosure.

Referring briefly to FIG. 3, embodiments of structure 100 may provide an alternative configuration in which IC component 102 is coupled between the gate terminal of depletion-mode transistor 106 and one source/drain terminal of enhancement-mode transistor 110. In this configuration, depletion-mode transistor 106 may limit a current flow from its source terminal to the gate of enhancement-mode transistor 110. Moreover, I/O pad 103 may be coupled to a source/drain terminal of depletion-mode transistor 106 despite IC component 102 being coupled to the gate of depletion mode transistor 106. In all other respects, however, structure 100 may be structurally and operationally similar or identical to other embodiments of structure 100 discussed herein.

Figure 4:
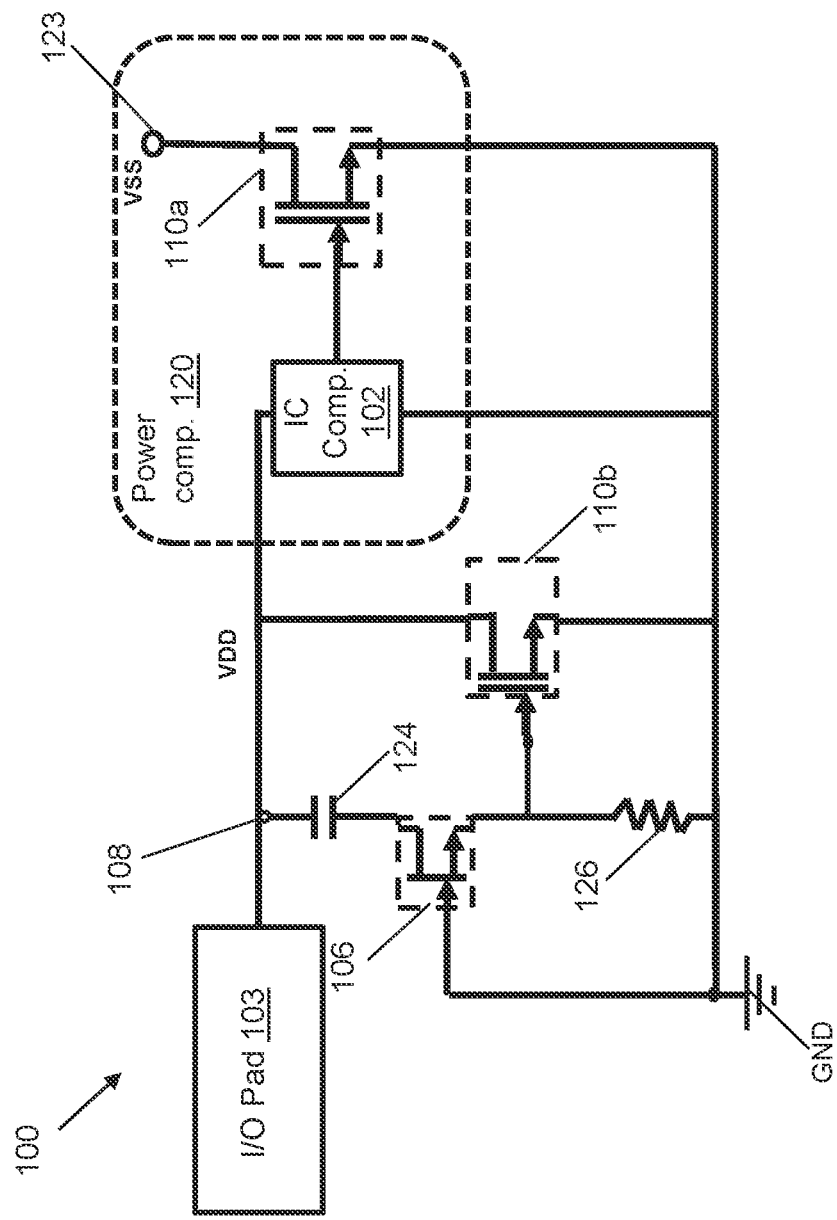
FIG. 4 provides a schematic diagram of a structure according to another embodiment of the disclosure.

Turning to FIG. 4, further embodiments of structure 100 may include multiple enhancement-mode transistors 110 (separately identified as first enhancement-mode transistor 110a and second enhancement-mode transistor 110b herein) to provide a resistor-capacitor (RC) clamp to protect power amplifier circuits during an ESD event. In this case, IC component 102 and/or I/O pad 103 may include a voltage source configured to output a supply voltage VDD to input node 108. IC component 102 (e.g., a voltage driven power amplifier) and/or I/O pad 103 may be coupled to input node 108, and thus may receive supply voltage VDD. IC component 102 and/or I/O pad 103 may provide input power to a power component ("power comp.") 120 coupled thereto. Power component 120 may include, e.g., a power amplification, power amplification, and/or other component within or electrically coupled to power generation components of a device. In such cases, IC component 102 may be a driver, amplifier, and/or other component for operating power component 120 via first enhancement-mode transistor 110a. During operation, IC component 102 and/or I/O pad 103 will enable power component 120 to have sufficient voltage for converting lower voltage inputs into higher voltage outputs. During an ESD event, IC component 102 and/or I/O pad 103 may be susceptible to negative effects arising from excessive voltages produced from the ESD event. Structure 100 may use depletion-mode transistor 106 and enhancement-mode transistors 110a, 110b to protect IC component 102 and/or I/O pad 103 from high voltages during an ESD event. As with other embodiments discussed herein, each transistor 106, 110a, 110b may be implemented as an HEMT over a III-V semiconductor substrate. In certain implementations, transistors 106, 110a, 110b each may include an aluminum gallium nitride (AlGaN) a GaN layer. The channel of the transistor may be provided through an AlGaN/GaN interface that is between the AlGaN layer and the GaN layer.

In this configuration, structure 100 may include first enhancement-mode transistor 110a having a gate coupled to IC component 102 and/or I/O pad 103 and a first source/drain terminal coupled to ground GND. Another source/drain terminal of first enhancement-mode transistor 110a may be coupled to a node 123 that is electrically decoupled from IC component 102 and/or I/O pad 103. Node 123 may be set to a separate voltage level VSS that may be equal to zero volts, and/or any other voltage suitable for coupling to ground through first enhancement-mode transistor 110a. Second enhancement-mode transistor 110b may have a first source/drain terminal coupled to IC component 102 and/or I/O pad 103 and another source/drain terminal coupled to ground GND, and a gate terminal coupled to the RC pathway within structure 100 as discussed herein. Depletion-mode transistor 106 may have a source/drain terminal coupled to input node 108 through a capacitor 124, and an opposing source/drain terminal coupled to ground GND through a resistor 126. Resistor 126 further may couple the gate of second enhancement-mode transistor 110b to the gate of depletion-mode transistor 106. Depletion-mode transistor 106 may be coupled to ground GND through its gate terminal through a coupling that does not include resistor 126, or other resistive elements, therein.

In conventional circuits, amplifier devices such as IC component 102 may be protected with RC clamp circuits. In the case of HEMTs including structures formed in GaN, the low voltage(s) needed to perform the clamping function can cause gate voltages to approach or exceed the breakdown voltage for an enhancement-mode HEMT, especially when the gate of the transistor is coupled directly to the capacitor of the RC clamp in certain configurations. As an example, enhancement-mode transistors 110a, 110b may be configured to operate at a threshold voltage of at most approximately eight volts (V). By including depletion-mode transistor 106 between the capacitor and the gate of one enhancement-mode transistor (i.e., second enhancement-mode transistor 110b), excessive gate voltages are avoided because higher voltages within the RC clamp will enable current flow through second enhancement-mode transistor 110b and create a direct current pathway from input node 108 to ground GND. During operation, this configuration of structure 100 will allow capacitors 124 of any size (and thus, capacitance) to be used without posing a risk of high gate voltages to first enhancement-mode transistor 110a. Depletion-mode transistor 106 may serve substantially the same function as in other embodiments of structure 100 without IC component 102 and/or I/O pad 103 therein, i.e., it may limit a current flow from input node 108 to ground GND based on source-drain current saturation between capacitor 124 and resistor 126.

Embodiments of the disclosure provide various technical and commercial advantages, examples of which are discussed herein. Various devices having HEMTs therein, particularly those integrating GaN into power generation or amplification components, generally require some amount of protection against ESD events. Otherwise, HEMTs and/or other GaN-including devices are susceptible to damage during operation, as well as during wafer tests and product assembly. Embodiments of structure 100 may avoid adding an additional resistor in series with the ESD component(s), which otherwise increases transition times for turning the gate of an HEMT on or off during normal operation. Notably, embodiments of the disclosure overcome these and other technical concerns by using multiple HEMT or other GaN compatible structures, rather than relying on conventional transistor technologies.

It should be understood that in the method and structures described above, a semiconductor material refers to a material whose conducting properties can be altered by doping with an impurity. Illustrative semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

The integrated circuit chips including the structure can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially" are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
    a depletion-mode transistor having a gate coupled to ground and a first source/drain terminal; and
    an enhancement-mode transistor having a gate coupled to a second source/drain terminal of the depletion-mode transistor and a first source/drain terminal coupled to the gate of the depletion-mode transistor.

2. The structure of claim 1, wherein the first source/drain terminal of the depletion-mode transistor is coupled to an integrated circuit (IC) component.

3. The structure of claim 1, wherein the depletion-mode transistor and the enhancement-mode transistor each include a high electron mobility transistor (HEMT) over a III-V semiconductor substrate.

4. The structure of claim 1, wherein the depletion-mode transistor and the enhancement-mode transistor each include an aluminum gallium nitride (AlGaN) layer over a gallium nitride (GaN) layer such that an AlGaN/GaN interface is between the AlGaN layer and the GaN layer.

5. The structure of claim 1, wherein the enhancement-mode transistor further includes a second source/drain terminal is decoupled from the first source/drain terminal of the depletion-mode transistor.

6. The structure of claim 1, wherein the depletion-mode transistor comprises a portion of an electrostatic discharge (ESD) protective circuit.

7. The structure of claim 1, wherein a pinch-off voltage of the depletion-mode transistor is at most approximately eight volts (V).

8. A structure comprising:
    a depletion-mode transistor including a first gate coupled to an integrated circuit (IC) component, a first source, and a first drain; and
    an enhancement-mode transistor including a second gate coupled to the first source, a second source coupled to the first gate through the IC component, and a second drain, wherein a composition of the first gate is different from a composition of the second gate.

9. The structure of claim 8, wherein the depletion-mode transistor and the enhancement-mode transistor are each over a III-V semiconductor substrate.

10. The structure of claim 8, wherein the depletion-mode transistor and the enhancement-mode HEMT each include an aluminum gallium nitride (AlGaN) layer over a gallium nitride (GaN) layer such that an AlGaN/GaN interface is between the AlGaN layer and the GaN layer.

11. The structure of claim 8, wherein the second drain is decoupled from the IC component.

12. The structure of claim 8, wherein the depletion-mode transistor comprises a portion of an electrostatic discharge (ESD) protective circuit.

13. The structure of claim 8, wherein a pinch-off voltage of the depletion-mode transistor is at most approximately eight volts (V).

14. A structure comprising:
    a first enhancement-mode transistor having a gate coupled to an integrated circuit (IC) component and a first source/drain terminal coupled to ground;
    a second enhancement-mode transistor having a first source/drain terminal coupled to the IC component, a second source/drain terminal coupled to ground, and a gate terminal; and
    a depletion-mode transistor having a first source/drain terminal coupled to a capacitor, a second source/drain terminal coupled to a resistor and the gate terminal of the second enhancement-mode transistor, and a gate terminal coupled to ground, wherein the resistor couples the gate terminal of the second enhancement-mode transistor and the second source/drain terminal of the depletion-mode transistor to gate of the depletion-mode transistor.

15. The structure of claim 14, wherein the gate terminal of the depletion-mode transistor includes a different material composition from the gate terminal of the first enhancement-mode transistor and the second enhancement-mode transistor.

16. The structure of claim 14, wherein the first enhancement-mode transistor, the second enhancement-mode transistor, and the depletion-mode transistor each include a high electron mobility transistor (HEMT) over a III-V semiconductor substrate.

17. The structure of claim 14, wherein the first enhancement-mode transistor, the second enhancement-mode transistor, and the depletion-mode transistor each include an aluminum gallium nitride (AlGaN) layer over a gallium nitride (GaN) layer such that an AlGaN/GaN interface is between the AlGaN layer and the GaN layer.

18. The structure of claim 14, wherein the first enhancement-mode transistor further includes a second source/drain terminal is decoupled from the IC component.

19. The structure of claim 14, wherein the depletion-mode transistor comprises a portion of an electrostatic discharge (ESD) protective circuit.

20. The structure of claim 14, wherein a pinch-off voltage of the depletion-mode transistor is at most approximately eight volts (V).

\* \* \* \* \*